United States Patent [19]

Nakayama et al.

[11] Patent Number: 4,477,855
[45] Date of Patent: Oct. 16, 1984

[54] PROTECTING SYSTEM FOR TRANSMISSION LINES

[75] Inventors: Keizo Nakayama, Hitachi; Kazuo Seo, Tohkai, both of Japan

[73] Assignee: Hitachi, Ltd., Tokyo, Japan

[21] Appl. No.: 396,376

[22] Filed: Jul. 8, 1982

[30] Foreign Application Priority Data

Jul. 10, 1981 [JP] Japan .................. 56-108633

[51] Int. Cl.³ .................................... H02H 9/00
[52] U.S. Cl. .................................... 361/54; 361/115
[58] Field of Search .......... 361/3, 59, 43, 54, 56, 361/57, 61, 64, 66, 68, 69, 71, 72, 74, 75, 81, 115

[56] References Cited

U.S. PATENT DOCUMENTS 4,130,850 12/1978 Cronin et al. .................. 361/54

FOREIGN PATENT DOCUMENTS 844758 7/1952 Fed. Rep. of Germany ...... 361/115
2037390 5/1971 Fed. Rep. of Germany ...... 361/81
157754 8/1978 Netherlands .................. 361/115

OTHER PUBLICATIONS

The Application of High-Speed Grounding Switches for Single Pole Reclosing on 500 kV Power Systems" IEEE Transactions on Power Apparatus and Systems, vol. PAS 100, No. 4, Apr. 1981.

*Primary Examiner*—Harry E. Moose, Jr.
*Attorney, Agent, or Firm*—Antonelli, Terry & Wands

[57] ABSTRACT

Transmission lines have both their terminals connected with bus lines through breakers, respectively, and connected to earth through earth switches, respectively. Protecting relay devices are fed with not only the outputs of voltage transformers and current transformers but also the contact signals made coactive with the breakers and earth switches at the terminals considered. Those contact signals are transmitted through signal transmission devices to the other terminals, and the contact signals of the breakers and earth switches at the other terminals are transmitted. The protecting relay devices detect the fault of the transmission lines, if any, to trip the breakers and to confirm the open states of the breakers from the breaker contact signals of the terminals considered and the other terminals thereby to close the earth switches. These earth switches are opened after a suitable time period to confirm the open states thereof from their contact signals at the terminals considered and the other terminals thereby to reclose the breakers.

4 Claims, 5 Drawing Figures

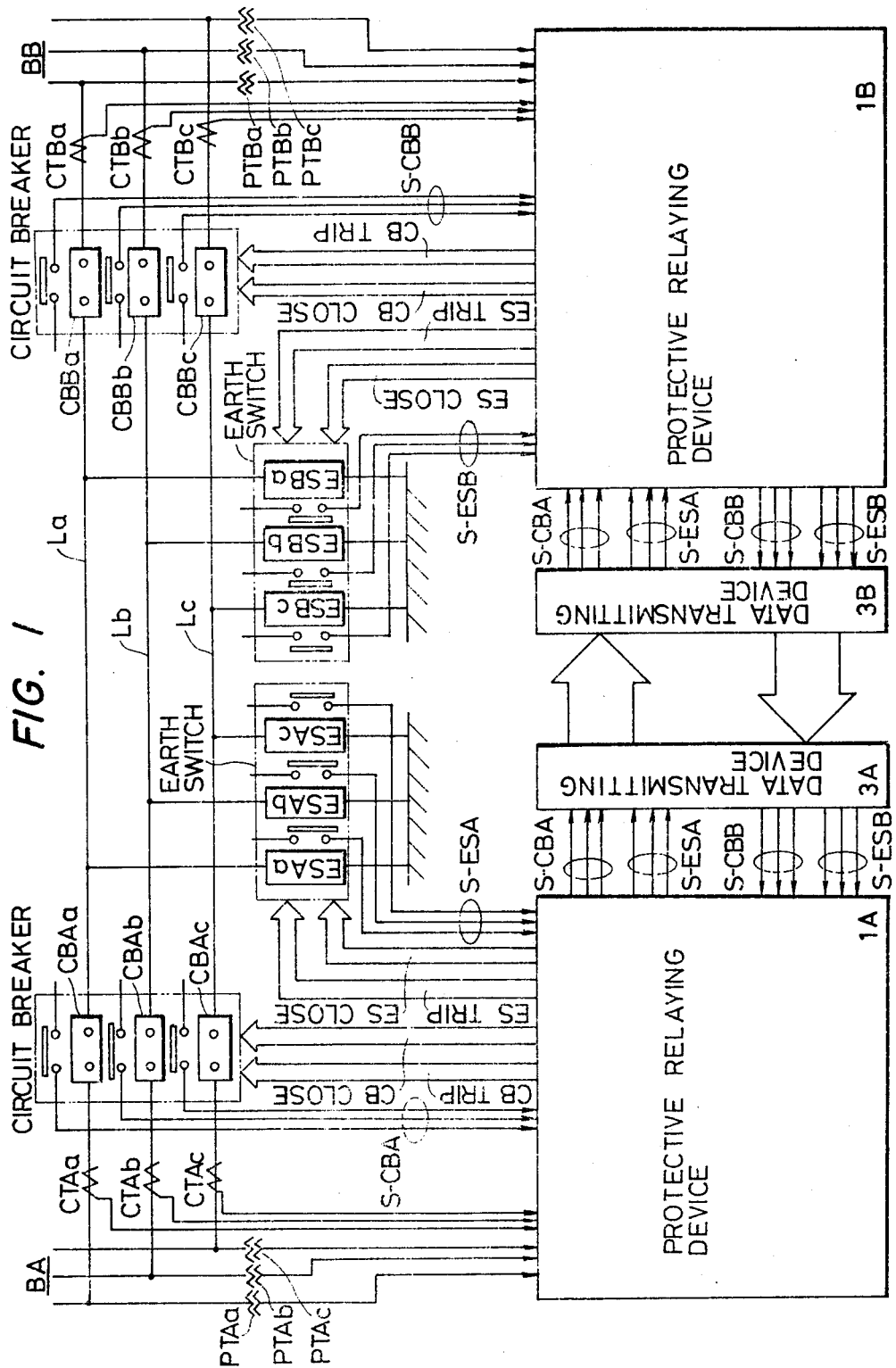

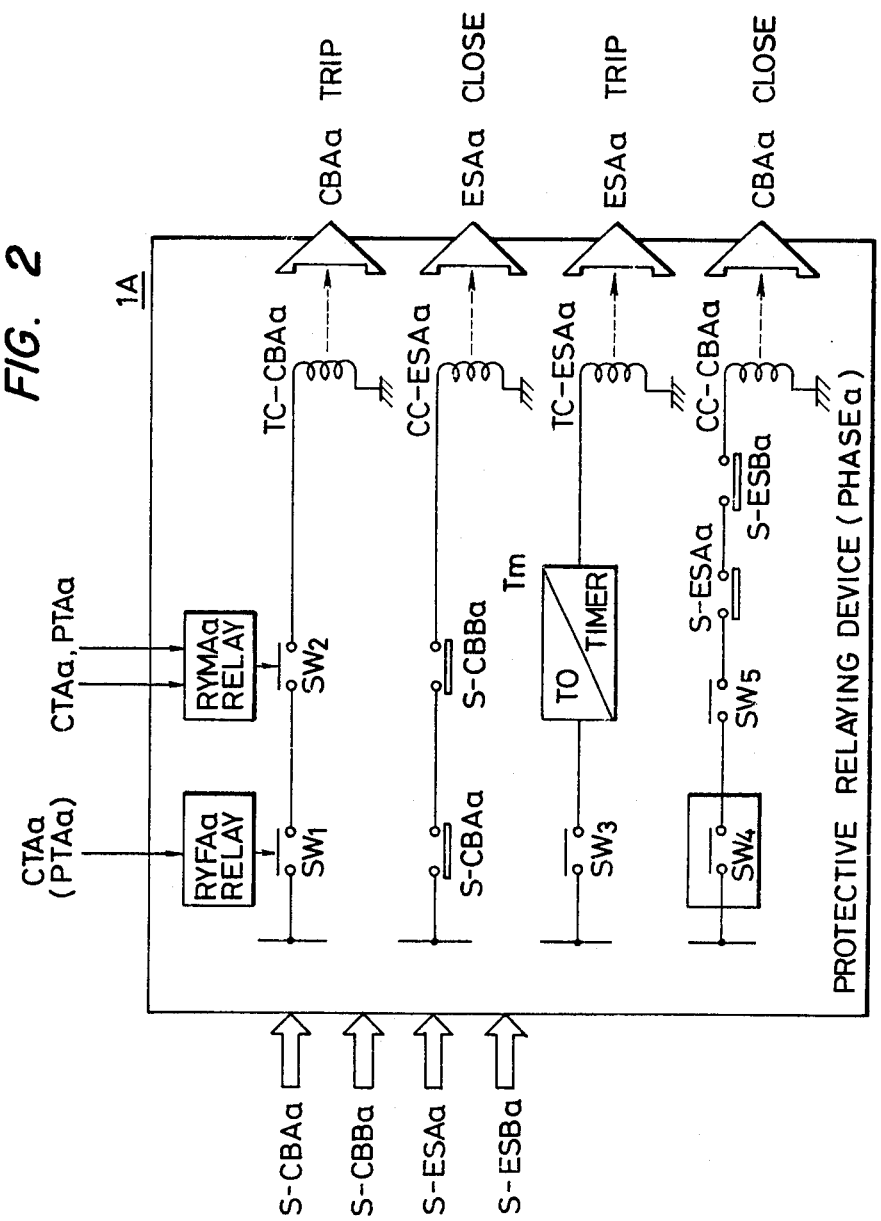

PROTECTING SYSTEM FOR TRANSMISSION LINES

BACKGROUND OF THE INVENTION

1. Field of the Invention

The present invention relates to a protecting system for transmission lines and, more particularly, to a transmission line protecting system which is enabled to forcibly ground a faulted transmission line by the use of grounding switches thereby to permit rapid auto reclosure.

2. Description of the Prior Art

Most of the faults occuring in a power system, especially in transmission lines, are caused by an arc resulting from a lightning strike. Therefore, the possibility of recovering the power supply is enhanced to a high level by reclosing the breaker of the transmission line under consideration after the breaker has been opened. This reclosure of the breaker is remarkably effective for maintaining the stability of the system. Therefore, the main transmission lines in recent years have been equipped with a reclosing system as an important function of a protecting relay device.

The following systems are adopted at present as examples of such reclosing systems:

(a) Single-Phase Reclosing System:

When a single phase earth fault occurs, only the faulted phase is selectively opened, and the corresponding breaker is reclosed after a predetermined time period (which will be referred to as the "dead time") sufficient for extinguishing the arc.

(b) Three-Phase Reclosing System:

All three phases are broken independently of the faulted phase, and the reclosure is conducted.

(c) Multi-Phase Reclosing System:

This system is applied to a two-circuit parallel transmission line arrangement. Only the faulted phases are selectively opened, and the reclosure is conducted in case the summed healthy phases for the two circuits are two or more different phases (e.g., A and B phases).

Here, the time period between the opening and the reclosure of the breaker, i.e., the dead time is set by the time, period for which the arc of the faulted point disappears. The dead time is selected at about 0.5 secs. for the transmission lines of 275 KV and about 1 sec. for the transmission lines of 500 KV. It is well known in the prior art that the time period for the arc to disappear generally gets longer as:

(a) the voltage becomes higher; and
(b) the transmission lines are made longer.

The reason therefor can be explained, as follows:

If three-phase transmission lines are faulted (e.g., if it is assumed that the a-phase is grounded to the earth) so that the a-phase breakers at both the terminals are opened, the energy supply to the faulted point of the a-phase from the generator (of the system) is eliminated so that the arc ought to disappear. However, since the b and c phases are left energized, the energy is supplied from the healthy phases, b and c to the faulted point through an interphase capacity. In case the voltage is low and the transmission lines are short (i.e., the capacity coupling is low), that energy supply can be ignored so that the arc naturally disappears. As the voltage gets higher and as the line length gets larger, the charging current through the interphase capacity is increased more. On the other hand, the potential to be determined by the capacity ratio to the earth is left in the broken phase to make the arc reluctant to disappear. In the transmission lines of about 1,000 KV scheduled to be constructed in the future, the estimations have reported that the arc is reluctant to disappear and takes several seconds, for example, until it disappears. The arc of this kind, which is induced by the healthy phases, is called the secondary arc.

On the other hand, it is desired for the stability of the system that the dead time be as short as possible. This will be briefly explained in the following. As is well known in the art, the phase difference angle of the voltage between the two terminals of a faulted transmission line is gradually increased until a deceleration energy corresponding to the acceleration energy received by the generator on account of the fault is obtained. As is also well known in the art, if the phase difference angle exceeds 90 degrees, the system becomes unstable and is brought out of control before long so that both the terminals of the transmission line have to be isolated for all the three phases. Moreover, if the breaker is reclosed after lapse of the dead time until the state before the fault can be restored, a higher deceleration energy (than that in the running state during the dead time) can be received. As a result, the possibility of restoring the stable running operation before the phase difference angle becomes large is higher as the dead time becomes shorter. If several seconds or more are required for the dead time, as has been described in the above, however, there arises a serious problem that the stability cannot be maintained.

The adoption of a forcibly grounding system using grounding switches is effective for the means for solving the problems thus far described. According to this system, the potential at the transmission line is forcibly lowered to abruptly extinguish the arc by grounding both the terminals of the opened line after the faulted phase has been opened. This forced grounding system is disclosed, for example, in IEEE Transactions on Power Apparatus and Systems, Vol. PAS-100, No. 4, April 1981, "The Application of High-Speed Grounding Switches for Single-Pole Reclosing on 500 KV Power Systems" R. M. Hasibar, A. C. Legate, J. Brunke, W. G. Peterson, Bonneville Power Administration Portland, Or.

The system disclosed in the above will be explained in the following. First of all, there are connected between power plants A and B three-phase transmission lines of a, b and c phases, each of which has both its terminals connected with breakers CB. Each of these breakers CB has their line-side terminals grounded to the earth through grounding switches ES, respectively. In a normal state, the breakers CB are closed, and the grounding switches ES are opened so that the elimination of a fault and the reclosing operation are conducted by the following procedures in case the fault occurs at a point F of the a phase:

(1) Breakers CB-A and CB-B at both the terminals of the a phase are opened by the actions of the protecting relay devices which are connected with both the terminals of the line.

(2) After the breakers CB-A and CB-B have been opened, grounding switches ES-A and ES-B at both the terminals of the faulted phases are closed to ground at both ends.

(3) After the dead time, the grounding switches ES-A and ES-B are opened.

(4) Next, the breakers CB-A and CB-B are closed.

The secondary arc current can be abruptly reduced by the processing operations according to the foregoing procedures disclosed in the aforementioned paper so that the dead time can be shortened. Thus, the forced grounding system using the grounding switches is effective.

However, it has been revealed that the forced grounding system invites the following disadvantages if the aforementioned processing procedures are mistaken. For example, the grounding switch ES-B is closed before the breaker CB-A is opened, or the breaker CB-A is closed before the grounding switch ES-B is opened. Thus, the operating procedures are liable to be reversed between the devices at the terminals A and B. The former case is equivalent to that the a-phase transmission line being short-circuited at its two different points (i.e., at the arc fault point and the point of the earth switch ES-B) to the earth. No special fault takes place if a breaker having breaking capability is red as the grounding switch. In many cases, however, since an inexpensive switch having no breaking capability is used, there is a fear that the switches may be damaged by the grounded current. On the other hand, the latter case is equivalent to that situation where the grounding fault occurs simultaneously with the reclosure of the breaker CB-A. In this case, the protecting relay device judges that the reclosure has failed to open all the phases a, b and c. Because the transmission lines are major ones intrinsically having a high capacity, the reclosing system is adopted so that the running operation may be devised to continue as long as possible even in the case of a fault. Moreover, the forced grounding system is adopted to improve the stability of the system. Nevertheless, the adoption of that forced grounding system may possibly deteriorate the working efficiency of the power system or the stability of the system.

SUMMARY OF THE INVENTION

It is, therefore, an object of the present invention to provide a transmission line protecting system which is enabled to reliably prevent the aforementioned disadvantages in case the forced grounding system is adopted.

According to the present invention, the states of breakers and grounding switches at both the terminals are mutually transmitted through communication system such as microwave circuits or power line carriers thereby to provide a safe and reliable forced grounding and reclosing system. More specifically:

(1) After a fault occurs, the breakers at both the terminals are opened to clear the fault.

(2) In case the grounding switches are to be subsequently closed, it is confirmed through the communication circuit that the breaker at the terminal under consideration is opened without fail and that the breaker at the other terminal is opened without fail. Likewise, when the grounding switch at the terminal B is to be closed, the open state of the breaker CB at the terminal A is confirmed.

(3) Next, after the grounding switches at both the terminals have been opened, a similar confirmation is conducted at the instant when the reclosure is to be effected. Specifically, when the breaker CB at the terminal A is to be closed, it is confirmed through the communication circuit that the grounding switch ES at the terminal B is opened. Likewise, upon the closure of the breark CB-B at the terminal B, the closure of the grounding switch ES-A at the terminal A is confirmed.

BRIEF DESCRIPTION OF THE DRAWINGS

FIG. 1 is a block diagram showing both the construction of the power system to which the present invention is applied and the input and output device of the system of the present invention;

FIG. 2 is a block diagram showing the specific circuit construction of the protecting relay device 1A of the present invention;

DESCRIPTION OF THE PREFERRED EMBODIMENT

Figure 3A:
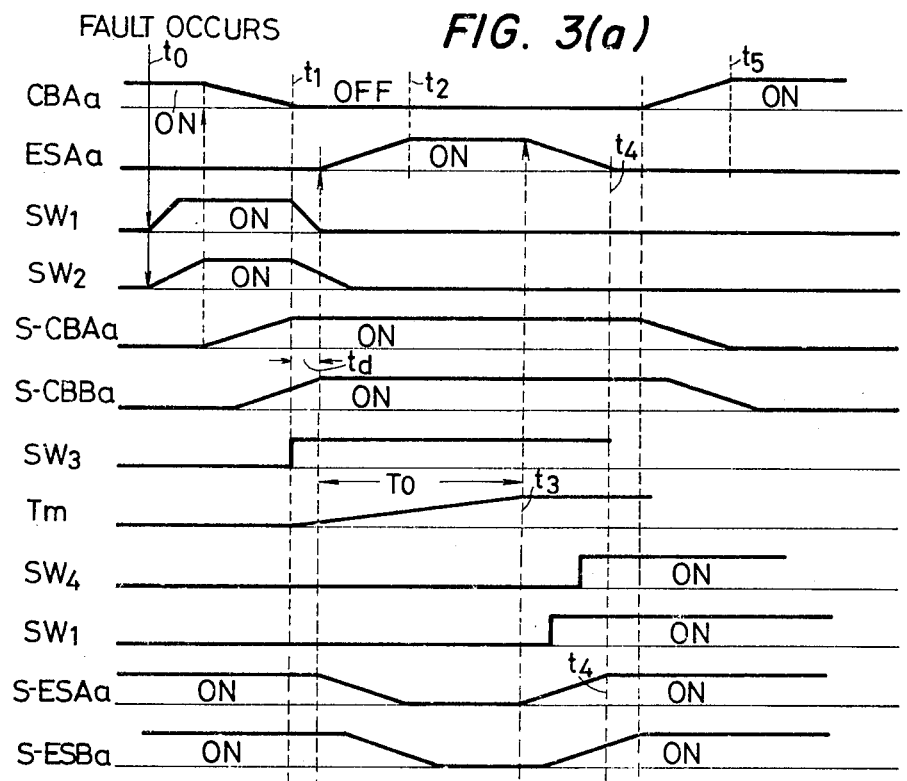
FIG. 3 is a time chart illustrating the operating situations of the respective portions of FIG. 2.

FIG. 1 shows the schematic constructions of the power system adopting the forcibly grounding system and the system according to the present invention. In FIG. 1: letters La, Lb and Lc indicate transmission lines of phases a, b and c, respectively; letters BA indicate a bus line of a power plant A; and letters BB indicate a bus line of a power plant B. Letters CB and ES indicate breakers and grounding switches, respectively. Letters A and B suffixed to the foregoing letters indicate that those devices are disposed at the power plants A and B, and letters a, b and c suffixed thereto indicate that those devices are disposed in the phases a, b and c. Letters CT and PT indicate current transformers and voltage transformers, respectively. The letters A, B, a, b and c suffixed to those transformers conform to the aforementioned indications of the letters. On the other hand, numeral 1 indicates a protecting relay device which is made operative to open the breaker in a faulted phase, when the fault occurs in the power system, and to close that particular breaker CB the aforementioned dead time after the breaker CB has been opened. The system of the present invention also controls the closing and opening operations of the earth switches ES. Numeral 3 indicates a signal transmission control device, which is widely used in the so-called "carrier protecting relay device" to mutually transmit the operating situations of the protecting relay device at the other terminal and the electricity detected at the other terminal thereby to detect the fault which has occurred in the protected section of the power system. The signal transmission control device 3 of the present invention is used not only for the aforementioned purpose but for transmitting the open and closed states of the breakers CB or the grounding switches ES. One specific embodiment of the protecting relay device 1 of the present invention will be described in the following with reference to FIG. 2.

The protecting relay device 1 of the present invention controls the opening and closing operations of not only the breakers but also the grounding switches at the terminal under consideration. The input signals necessary for those controls may be the voltage and current signals coming from the voltage and current transformers PT and CT at the terminals considered, the contact signals S-CBA and S-CBB indicative of the open and closed states of the breakers at the considered terminals and the other terminals, and the control signals S-ESA and S-ESB indicative of the open and closed states of the earth switches at the considered terminals and the other terminals. The signal transmission control devices 3A and 3B are used to mutually transmit those contact signals of those breakers CB and the grounding switches ES.

FIG. 2 shows the A-terminal protecting relay device 1A but omits the B-terminal protecting relay device 1B. This is because the devices 1A and 1B are made to have a substantially identical construction so that the construction and operations of the device 1B can be easily understood from the construction and operations of the device 1A. Moreover, FIG. 2 shows the portion for protecting the a-phase fault. The protecting portions for the b- and c-phase earth fault or phase fault are naturally included, but the protecting operations of single phase are sufficient for grasping the forcibly grounding operations of the system of the present invention. Incidentally, although no renewed description is required, the protecting portions of the other phases are made to have substantially the same constructions as that of the phase a.

In FIG. 2: letters RYFAa indicate an a-phase fault detecting (guard) relay, which may be either a overcurrent relay for detecting that the system current from the current transformer CTAa is excessive or an undervoltage relay for detecting that the system voltage from the voltage transformer PTAa is down. Letters RYMAa indicate the main relay of the phase a, which is enabled to discriminate that the fault lies in the protecting section of the power system. The main relay RYMAa may be based on a variety of operating principles but may suitably use a pilot relay system such as a pilot wire relay system, in which pilot wires are connected between the power plants thereby to circulate the respective power plant currents therethrough, a phase comparing relay system, in which the data as to the current phases of the respective power plants are mutually transmitted, or a direction comparing relay system, in which the direction of a fault current is judged at the respective power plants so that the results are mutually transmitted to judge the internal fault. In an alternative, the main relay may be a distant relay system which is enabled to judge the intersection fault in accordance with only the data obtained at the power plant at the considered terminal, as exemplified by the fault detecting relay RYMAa of FIG. 2. This fault detecting relay is a mho-characteristic distant relay, which is made operative to compose the electricity of $(\dot{I}\dot{Z}-\dot{V})$ from a current $\dot{I}$ at the considered terminal, a voltage $\dot{V}$ at the considered terminal and a setting impedance $\dot{Z}$ thereby to feed it to the outside when an equality of $(\dot{I}\dot{Z}-\dot{V})=\dot{V}$ holds. As shown in FIG. 2, as a result that a fault occurs in the transmission line La, the fault detecting relay RYFAa operates to close a contact $SW_1$, and the main relay RYMAa operates to close a contact $SW_2$ when it confirms that the fault lies in the protecting section. When this condition is satisfied, the tripping coil TC-CBAa of the a-phase breaker CBAa of the power plant A is energized to open the breaker CBAa.

In view of the situation of the terminal B, on the other hand, if an internal fault is detected at the protecting relay device 1B, an a-phase breaker CBBa is tripped by an opening command. Contact signals S-CBAa and S-CBBa indicative of the open and closed states of the breakers CBAa and CBBa are mutually transmitted through the signal transmission control devices 3 and are fed to the detecting relay devices 1A and 1B. The closing coil CC-ESAa of a grounding switch ESAs is controlled by the opening and closing contacts S-CBAa and S-CBBa of the breakers CBAa and CBBa at both the terminals. Those contacts S-CBAa and S-CBBa are contacts which are closed when their respective breakers are open. As a result, before breakers CBAa and CBBa of the considered phase at both the terminals are opened, the closing coil CC-ESAs is not energized so that the grounding switch ESAa is not closed. This eliminates a fear that both the breakers CB and the grounding switches ES are closed, when the fault is to be eliminated, to damage the devices such as the grounding switches ES. Incidentally, the device 1B at the terminal 1B similarly closes the earth switch ESBa.

As has been described in the above, the reclosing operations of the transmission lines are started a suitable time period after the fault of the a-phase transmission line is eliminated and forcibly grounded to the earth. Generally, the reclosure can be effected merely by closing the breakers CBAa and CBBa. Prior to this, the earth switches ESAa and ESBa are opened according to the present invention. In FIG. 2, letters TC-ESAs indicate the closing coil of the earth switch ESAa, which coil is not energized to open the grounding switch ESAs before it is confirmed by a timer $T_m$ that a time period $T_o$ has elapsed after a contact $SW_3$ has been closed. Here, the contact $SW_3$ is not closed before the tripping coil TC-CBAa of the breaker CBAa is energized or before the breaker CBAa is resultantly opened. Generally speaking, incidentally, a tripping coil Tc is deenergized when the breaker is opened, and the time period for the magnetization is equal to or shorter than 100 msecs. As a result, in case the contact $SW_3$ is prepared by the fact that the tripping coil TC-CBAa is energized, it is necessary to memorize that the tripping coil TC-CBAa is energized and to open and close the contact $SW_3$ in accordance with the memorized result. The time period $T_o$ for the timer $T_m$ to generate the operating output may be substantially equal to the dead time.

As a result, at the instant when the grounding switch ESAa is opened, the secondary arc currents from the healthy phases b and c by the electricmagnetization or electrostatic induction have already disappeared so that an inexpensive breaker having no turn-off capability can be used as the grounding switch. The time periods $T_o$ of the timers $T_m$ of the devices 1A and 1B at both the terminals are set to be substantially equal to each other so that the earth switches ESAa and ESBa of the faulted phase at both the terminals are opened substantially simultaneously. The contact signals S-ESAa and S-ESBa indicative of the open and closed states of those grounding switches are mutually transmitted and received by the signal transmission control devices 3.

The closing coil CC-CBAa of the breaker CBAa has its magnetization controlled by the contacts, which indicate the open and closed states of the grounding switches at both the terminals, a reclosure condition contact $SW_4$ and a contact $SW_5$ to be closed after the dead time. Of those, the former contacts S-ESAa and S-ESBa are closed, while the earth switches are open, so that the breakers CB are not closed unless the earth switches ES at both the terminals are opened. Thus, according to the present invention, the breakers CB and the grounding switches ES are prevented from being simultaneously closed even when the breakers CB are reclosed. The reclosure condition contact $SW_4$ is different in accordance with the respective reclosing systems but is closed when the following conditions are satisfied.

For single-phase reclosing system:
The other phases of the circuit considered are healthy.

For three-phase reclosing system:

The two conditions: for example, (1) the breakers of the adjoining circuit are closed so that power flows in the adjoining circuit; and (2) No fault lies in the remaining system are satisfied.

For multi-phase reclosing system:

The two conditions: (1) Two or more phases summed for the two circuits are associated; and (2) No fault lies in the system are satisfied.

As has been described, the reclosures of the breakers CB according to the present invention are effected on condition of the opening operation of the grounding switches in addition to the two conditions well known in the art: after lapse of the dead time; and the holding of the reclosure.

The reclosing operations can be conducted in the manners thus far described. If the fault is a permanent one, the reclosure fails so that all the phases are opened even if the fault lies only in the phase a. The sequences for detecting the failure in the reclosure to open all the phases are omitted from FIG. 2.

Figure 3B:
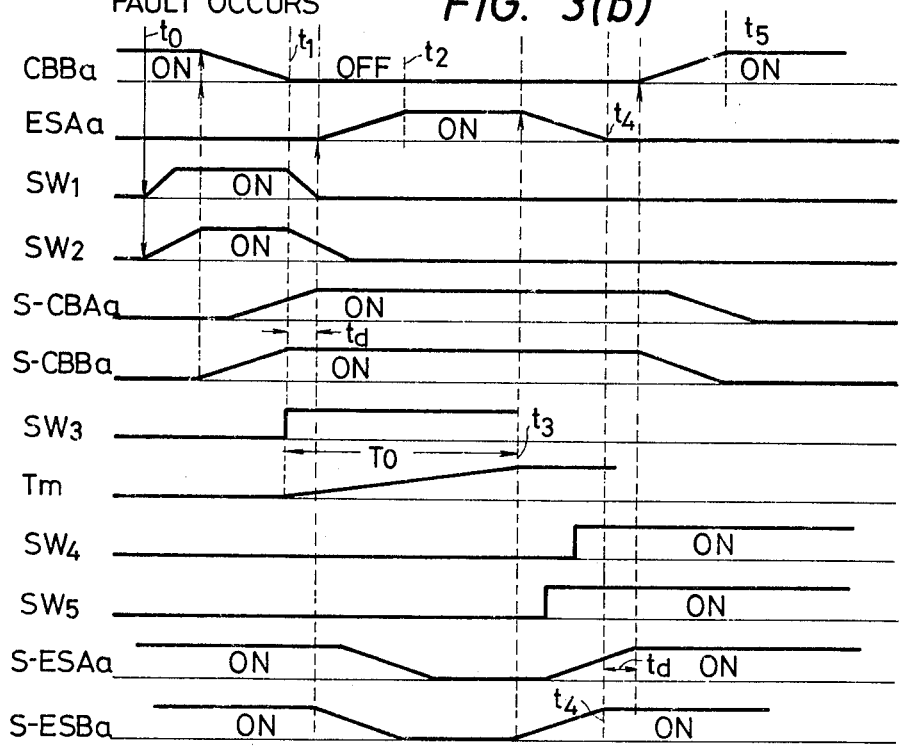

FIG. 3 is a time chart illustrating the operating situations of the respective portions of the system of the present invention. The fact that the breakers CB and the earth switches ES are not simultaneously closed will be explained with reference to FIG. 3. FIG. 3(a) illustrates the operations of the system at the terminal A, whereas FIG. 3(b) illustrates the operations of the system at the terminal B.

First of all, if a fault of the phase a occurs at a time $t_o$, the a-phase fault detecting relays RYFAa and RYFBa operate to close the contact $SW_1$, and then the a-phase main relays RYMAa and RYMBa operate to close a contact $SW_2$ thereby to energize the tripping coils TC-CBAa and TC-CBBa (although not shown). The breakers CBAa and CBBa are opened substantially simultaneously at a time $t_1$. The contact S-CBAa at the terminal A and the contact S-CBBa at the terminal B have their states instantly changed in association with the operations of the breakers at the terminal considered, respectively. On the contrary, the contact S-CBBa at the terminal A and the contact S-CBAa at the terminal B have their states changed after a transmission delay time $t_d$. As a result, the closing coil CC-ESAa of the grounding switch ESAa and the closing coil CC-ESBa of the not-shown grounding switch ESBa are magnetized so that the grounding switches ESAa and ESBa are closed.

On the other hand, the contacts $SW_3$ at the respective terminals, which are associated with the breaker CBAa or the breaker CBBa, are turned on at the time $t_1$, whereupon the timer $T_m$ starts its timing operation. This timer $Y_m$ generates its output at a time $t_3$ after a time period $T_o$ thereby to energize the tripping coils TC-ESAa and TC-ESBa (although not shown). As a result, the grounding switches ESAa and ESBa are opened at a time $t_4$. In accordance with the changes in the states of the grounding switches ESAa and ESBa, the contacts S-ESAa and S-ESBa have their states changed, but the signals fed from the other terminals through the transmission control devices 3 are delayed for the time $t_d$. If the contacts $SW_4$ and $SW_5$ are closed when the contacts S-ESAa and S-ESBa are closed together, the closing coils CC-CBAa and CC-CBBa (although not shown) are energized thereby to close the breakers CBAa and CBBa at a time $t_5$.

As has been described hereinabove in detail with reference to FIG. 3, the breakers CB and the grounding switches ES are not simultaneously closed. Incidentally, the contacts $SW_1$ and $SW_2$ restore their initial states before long after the time $t_1$ because the fault is eliminated by opening the breakers CB. On the other hand, it is needless to say that the timer $T_m$ and the contacts $SW_4$ and $SW_5$ are so interlocked, although not shown, as to restore their initial states a proper time after they have been reclosed.

Figure 4:
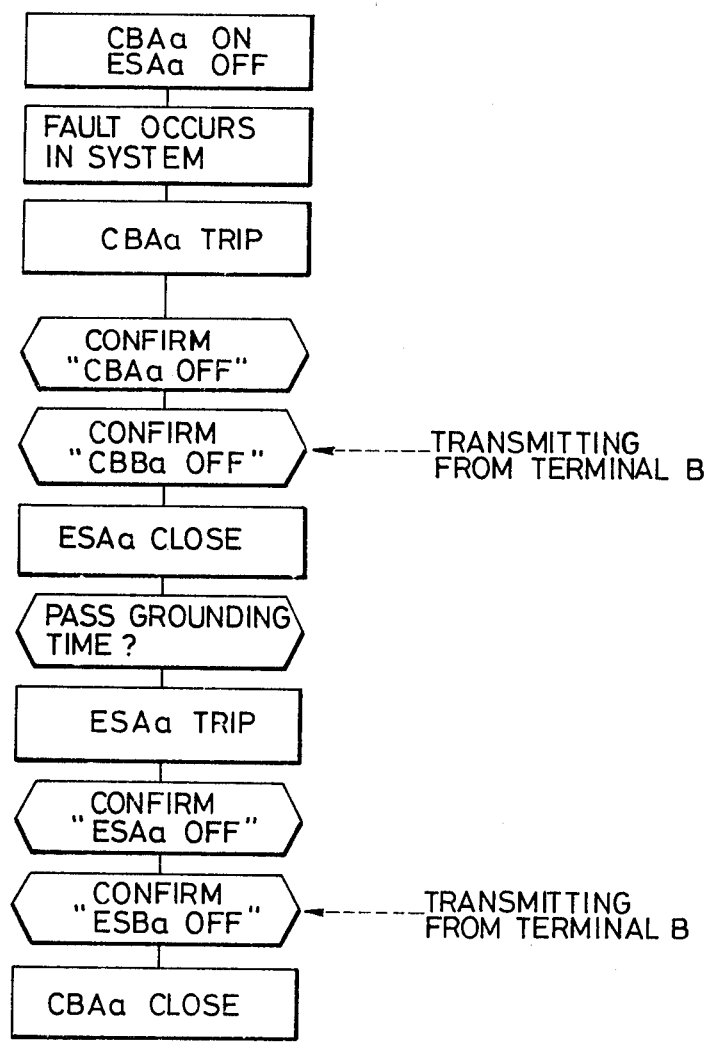
FIG. 4 is a flow chart illustrating a series of procedures of the present invention.

FIG. 4 is a flow chart illustrating a series of procedures of the present invention. The flow of this chart would be easily understood from the description thus far made so that its repeated explanations are omitted here. The summary for their embodiment will be briefly described in the following.

(a) The present reclosing circuit can be easily realized by combining the logic circuits, when it is to be constructed, so that a more specific and real example of the hardware construction is not explained.

(b) The transmission of the open and closed states of the breakers and grounding switches at the other terminals, which is the major intention of the present invention, can be easily realized by using the microwave circuits or the signal circuits for power line carriers which are widely used in the protecting relaying system.

(c) The method of detecting the open states of the breakers is generally exemplified by a method in which the open states are judged from the ON/OFF operations of the auxiliary contacts of the breakers themselves.

(d) The forcibly grounding time period is necessary for extinguishing the arc and should be determined by the several conditions such as the voltage or length of the transmission lines but may be sufficient if it has a value of 0.2 to 0.3 secs. This time period can be easily set by the usual time relay.

As has been described hereinbefore, the present invention can be easily realized without any special technical problem, when it is practised, and can enjoy the following advantages over those of the system of the prior art:

(1) Since the open and closed states of the devices at the other terminals are confirmed when in the forcibly grounding operation and in the reclosing operation, a serious situation can be obviated, in the case grounding switches are not opened, for example, by preventing the breakers at the other terminals from being closed.

(2) Since the open and closed states of the breakers and the grounding switches at the other terminals are introduced through the communication circuit in a sequential manner into the closing circuit, the time margin from the breaker "OFF" to the Grounding switch "ON" and the time period from the earth switch "OFF" to the breaker "ON", as shown in FIG. 3, can be shortened so that the dead time can be totally shortened. This can highly contribute to the maintenance of the system stability.

What is claimed is:

1. A transmission line protecting system for protecting transmission lines which each have first terminals at one end and second terminals at another end, said system comprising:

protecting relay devices connected with the first and second terminals of the transmission lines;

breakers coupled to said first and second terminals of said transmission lines for breaking fault currents along said transmission lines in response to commands from said protecting relay devices;

grounding switches connected with the first and second terminals of said transmission lines; and a transmission circuit for transmitting the open and closed states of said breakers and said grounding switches at the first and second terminals of the transmission lines, wherein said system further includes means for only closing said grounding switches of a transmission line after it is confirmed through said transmission circuit that the breakers at the first and second terminals of the transmission line are opened when one or more of said transmission lines are faulted.

2. A transmission line protecting system as set forth in claim 1, wherein closing said grounding switches executes a forced grounding operation, and wherein said system further comprises means for ensuring that said breakers for a transmission line are not closed after execution of the forced grounding operation until it is confirmed through said transmission circuit that the breakers at the first and second terminals of said transmission line are opened.

3. A protecting system for transmission lines which have terminals at respective ends thereof connected with bus lines through breakers and connected to the earth through earth switches, comprising:

first means for opening said breakers of a transmission line when a fault occurs in one or more of said transmission lines;

second means for detecting that said breakers are opened to close said earth switches;

third means for opening said earth switches after lapse of a time period sufficient for extinguishing an arc in said transmission lines; and fourth means for detecting the open states of said earth switches to close said breakers.

4. A transmission line protecting system as set forth in claim 3, wherein contact signals made coactive with said breakers and said earth switches are transmitted through transmission lines so as to confirm the open and closed states of said breakers and said earth switches.

* * * * *